United States Patent
Kinoshita (10) Patent No.: US 6,531,746 B2
(45) Date of Patent: Mar. 11, 2003

(54) SEMICONDUCTOR DEVICE WITH HIGH-SPEED SWITCHING CIRCUIT IMPLEMENTED BY MIS TRANSISTORS AND PROCESS FOR FABRICATION THEREOF

(75) Inventor: Yasushi Kinoshita, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/725,271

(22) Filed: Nov. 29, 2000

(65) Prior Publication Data

US 2001/0008286 A1 Jul. 19, 2001

(30) Foreign Application Priority Data

Nov. 30, 1999 (JP) .............................. 11-339618

(51) Int. Cl.$^7$ ............................................. H01L 29/72
(52) U.S. Cl. ................... 257/365; 257/369; 257/371; 257/401; 257/402
(58) Field of Search ............................ 257/365, 401, 257/369, 371, 402

(56) References Cited

U.S. PATENT DOCUMENTS 4,670,669 A * 6/1987 Cottrell et al. ............... 257/401
6,147,386 A * 11/2000 Horiuchi ...................... 257/369

FOREIGN PATENT DOCUMENTS

| JP | 9-172091 | 6/1997 |
| JP | 10-50941 | 2/1998 |
| JP | 10-135348 | 5/1998 |
| JP | 10-335589 | 12/1998 |

* cited by examiner

Primary Examiner—Edward Wojciechowicz
(74) Attorney, Agent, or Firm—McGinn & Gibb, PLLC (57) ABSTRACT

An n-channel type MIS field effect transistor is fabricated on a p-type well defined in a standard p-type silicon substrate, and is expected to respond to a high-frequency signal, wherein a heavily-doped p-type well contact region is formed outside of the p-type well for increasing the substrate resistance, and a capacitor is coupled to the heavily-doped p-type well contact region for increasing the impedance so that the insertion loss is reduced by virtue of the large impedance of the silicon substrate.

14 Claims, 13 Drawing Sheets

SEMICONDUCTOR DEVICE WITH HIGH-SPEED SWITCHING CIRCUIT IMPLEMENTED BY MIS TRANSISTORS AND PROCESS FOR FABRICATION THEREOF

FIELD OF THE INVENTION

This invention relates to a semiconductor device and, more particularly, to a semiconductor device with a switching circuit responsive to a high-frequency signal and a process for fabrication thereof.

DESCRIPTION OF THE RELATED ART

The mobile market is growing in the world. The mobile telephones and the wireless LAN (Local Area Network) are in great demand. The mobile telephones and the portable terminals are expected to process information carried on a high-frequency signal in GHz band. The prior art high-frequency analog circuit was fabricated from discrete circuit components such as discrete bipolar transistors fabricated on silicon chips and metal-semiconductor field effect transistors fabricated on gallium arsenide chips. Since the discrete circuit components were integrated on a circuit board, the high-frequency analog circuit on the circuit board set a limit on the volume of those electric products, and the production cost was hardly reduced.

MOS (Metal-Oxide-Semiconductor) field effect transistors are integrated on a silicon chip, and have enhanced the transistor characteristics through the down-scaling. Current silicon integrated circuit devices are designed under 0.18 micron rules. These miniature MOS field effect transistors are considered to be capable of responding to the high-frequency signal in the GHz band. If the high-frequency analog circuit were integrated on a single silicon chip, the electric products would be drastically scaled down.

A low-noise amplifier, a mixer, a driver amplifier and a high-frequency switch are required for the high-frequency analog circuit for the radio frequency signal. The high-frequency switch is incorporated in a duplexer. A low insertion loss and high separation characteristics between the input and the output are expected to the high-frequency switch.

Figure 1:
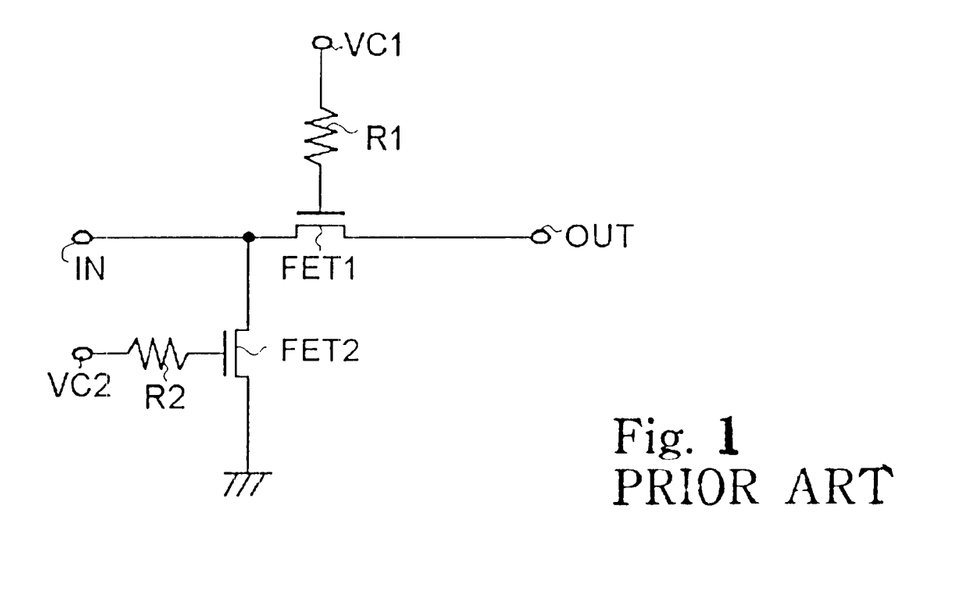
FIG. 1 is a circuit diagram showing the prior art high-frequency switching circuit.

FIG. 1 illustrates the prior art high-frequency switching circuit. Reference symbols "IN" and "OUT" designate a signal input node and a signal output node, respectively. A field effect transistor FET1 is connected between the signal input node IN and the signal output node OUT, and a control node VC1 is connected through a resistor R1 to the gate electrode of the field effect transistor FET1. Another field effect transistor FET2 is connected between the signal input node IN and a ground line. A control node VC2 is connected through a resistor R2 to the gate electrode of the field effect transistor FET2.

The prior art high-frequency switching circuit behaves as follows. The control nodes VC1 and VC2 are assumed to be in a high level and a low level. The field effect transistor FET1 turns on, and the field effect transistor FET2 turns off. The signal input node IN is electrically isolated from the ground line, but is electrically connected to the signal output node OUT. Thus, the signal input node IN is connected through the prior art high-frequency switching circuit to the signal output node OUT.

On the other hand, when the control nodes VC1 and VC2 are changed to the low level and the high level, respectively, the field effect transistor FET1 turns off, and the other field effect transistor FET2 turns on. The signal input node IN is electrically isolated from the signal output (node OUT, but is connected through the field effect transistor FET2 to the ground line. Thus, the prior art high-frequency switching circuit separates the signal input node IN from the signal output node OUT. Although the insertion loss and the separation characteristics are dependent on the transistor characteristics of the field effect transistors FET1 and FET2, the parasitic components have influences thereon. If the influences of the parasitic components are displaced from the prior art high-frequency switching circuit, the prior art high-frequency switching circuit is further improved.

Figure 2:
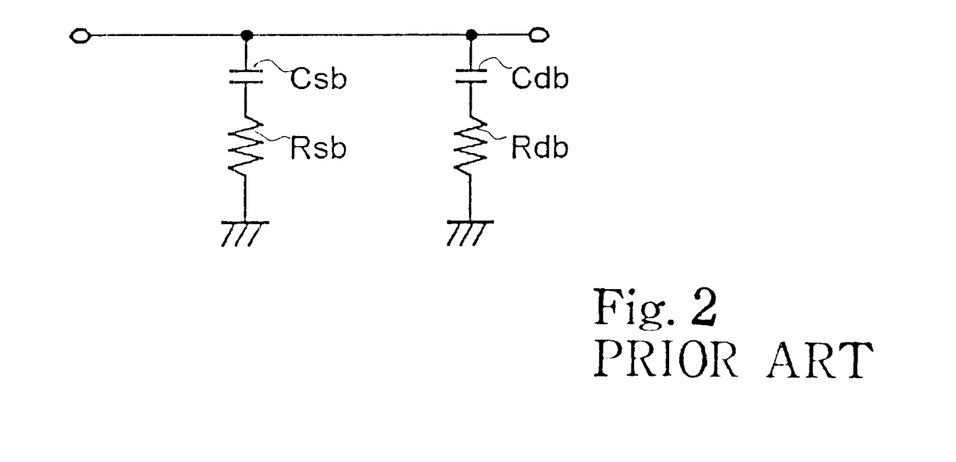
FIG. 2 is a circuit diagram showing the equivalent circuit of the prior art high-frequency switching circuit.

FIG. 2 illustrates an equivalent circuit of the prior art high-frequency switching circuit on the assumption that a silicon substrate is used and that the field effect transistors FET1 and FET2 have a channel resistance of zero in the on-state. Csb is a parasitic capacitor due to the p-n junction between the source region and the silicon substrate, and Cdb is a parasitic capacitor due to the p-n junction between the drain region and the silicon substrate. Rsb is the resister between the source region and the ground line through the silicon substrate, because the silicon substrate is biased with the lowest potential level. Similarly, Rdb is the resister between the drain region and the ground line through the silicon substrate. The gate capacitance of the field effect transistor FET1/FET2 is much smaller than the capacitance of the parasitic capacitor Csb/Cdb, and is ignoreable. Thus, a leakage path takes place through the parasitic capacitor Csb/Cdb and the parasitic resistor Rsb/Rdb. The leakage path is ignoreable in the metal-semiconductor field effect transistor fabricated on the gallium arsenide chip, because the gallium arsenide substrate is semi-insulating. However, the leakage path is the serious problem inherent in the field effect transistor fabricated on the silicon chip.

Figure 3:
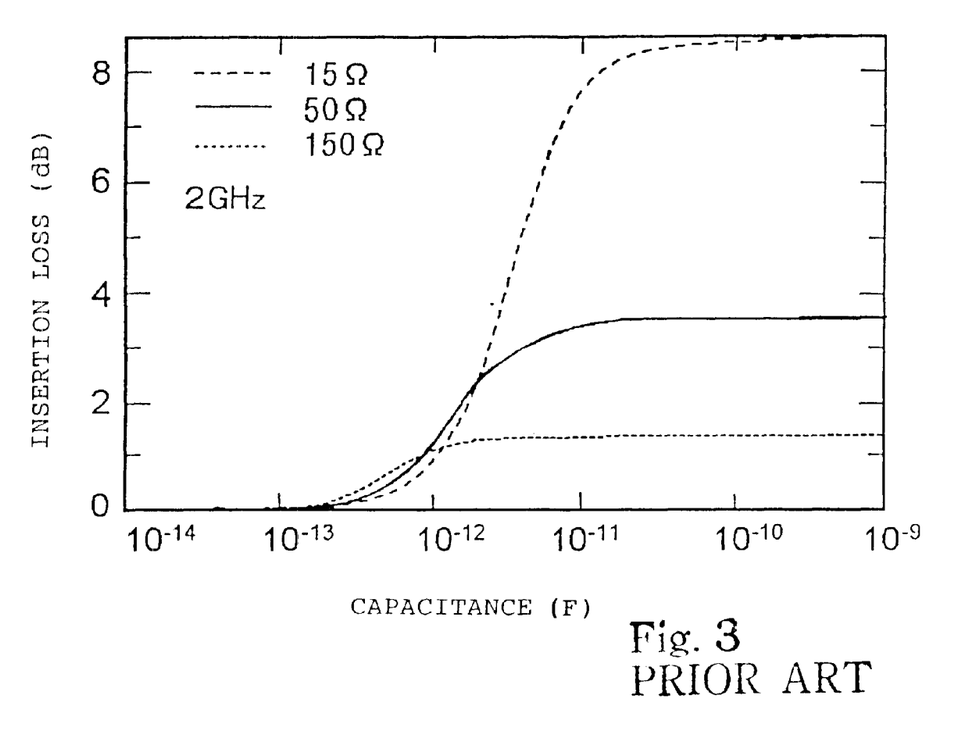
FIG. 3 is a graph showing the insertion loss in terms of the capacitance coupled between the field effect transistor and the substrate.

FIG. 3 shows the influence of the parasitic capacitance coupled between the field effect transistor and the substrate on the insertion loss. The frequency is 2 GHz. The substrate resistance is 15 ohms, 50 ohms and 150 ohms. The broken line, the real line and the dots are representative of the relation at 15 ohms, 50 ohms and 150 ohms, respectively. The insertion loss is increased together with the capacitance. However, the influence of the parasitic capacitor is more serious at a low substrate resistance rather than at a high substrate resistance.

Figure 4:
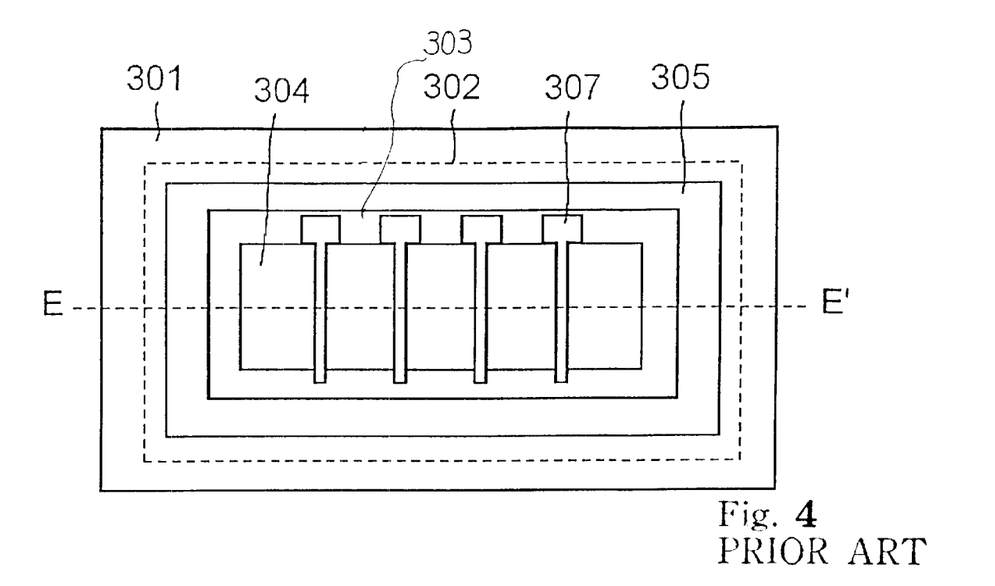
FIG. 4 is a plane view showing the layout of the prior art field effect transistors integrated on the silicon substrate.
Figure 5:
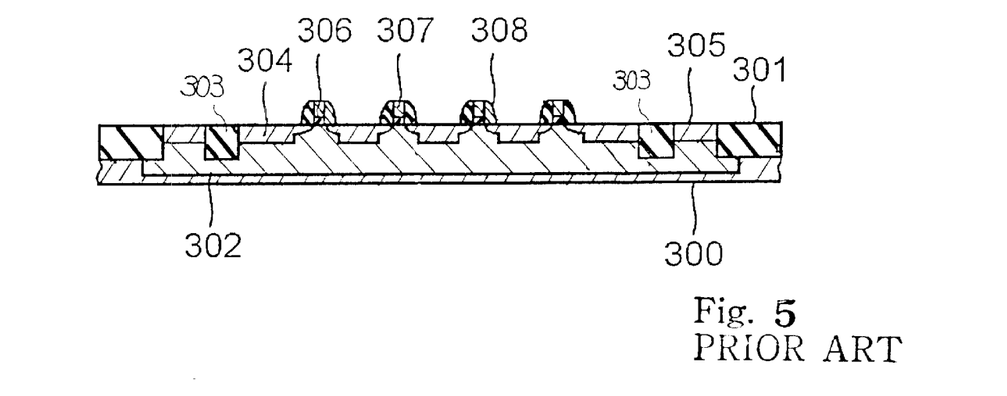
FIG. 5 is a cross sectional view taken along line E–E' of FIG. 4 and showing the structure of the prior art field effect transistors.

FIGS. 4 and 5 illustrate a standard structure of MOS field effect transistors fabricated on a p-type silicon substrate 300. The plural MOS field effect transistors are equivalent to each of the field effect transistors FET1/FET2. A p-type well 302 is formed in the surface portion of the p-type silicon substrate 300, and a shallow trench isolation 301 is formed at the boundary between the p-type silicon substrate 300 and the p-type well 302. N-type source/drain regions 304 are formed in the p-type well 302 at intervals, and a heavily-doped p-type well contact region 305 is also formed in the p-type well 302. The p-type well contact region 305 is larger in dopant concentration than the p-type well 302. A shallow trench isolation 303 is formed along the boundary between the heavily-doped p-type well contact region 305 and the n-type source/drain regions 304.

A channel region is formed between the adjacent two heavily-doped n-type source/drain regions 304, and is covered with a gate oxide layer 306. Four gate electrodes 307 are formed on the gate oxide layers 306, respectively, and are opposed to the channel regions. Side wall spacers 308 are formed on both side surfaces of the gate electrodes 307, and the n-type source/drain regions 304 have the LDD (Lightly Doped Drain) structure. The n-type source/drain regions 304, the channel region, the gate oxide layer 306, the gate electrode 307 and the side wall spacers 308 as a whole constitute the standard MOS field effect transistor.

The dopant concentration of the p-type well 302 is larger than that of the p-type silicon substrate 300 from the viewpoint of restriction of the short channel effect and the latch-up phenomenon. In other words, the resistivity of the p-type well 302 is lower than that of the p-type silicon substrate 300. The p-type well contact region 305 is larger in dopant concentration than the p-type well 302, and, accordingly, is lower in resistivity than the p-type well 302. Thus, the heavily-doped p-type well contact region 305 is nested in the p-type well 302, which in turn is nested in the p-type silicon substrate 300.

The field effect transistors FET1/FET2 are assumed to be designed in the standard MOS structure. Each of the field effect transistors FET1/FET2 is formed in the p-type well 302 nested in the p-type silicon substrate 300. If the field effect transistors FET1/FET2 are designed under the 0.18 rules, the gate length is 0.18 micron, and the substrate resistance is 50 ohms to 80 ohms. The substrate resistance is too large, and the insertion loss is serious. A highly resistive silicon substrate structure is required for the prior art high-frequency switching circuit. However, the p-type silicon substrate structure 300/302/305 is appropriate to digital circuits. Additional steps are required for fabricating the prior art high-frequency switching circuit together with the digital circuits. The fabrication process is complicated, and the production cost is increased.

SUMMARY OF THE INVENTION

It is therefore an important object of the present invention to provide a semiconductor integrated circuit device which is improved in high-frequency characteristics without sacrifice of the restriction of the short-channel effect and the latch-up phenomenon.

It is also an important object of the present invention to provide a process for fabricating the semiconductor device through a standard MIS process.

To accomplish the objects, the present invention proposes to separate a well contact region from a well by an isolating region.

In accordance with one aspect of the present invention, there is provided a semiconductor integrated circuit device comprising a semiconductor substrate of one conductivity type, a well of the one conductivity type formed in a first region of the semiconductor substrate, a circuit component fabricated on the well, a well contact region of the one conductivity type formed in a second region of the semiconductor substrate spaced from the first region and connected to a constant voltage source for supplying a bias voltage through the semiconductor substrate to the well and a first isolating region formed in a portion of the semiconductor substrate located between the first region and the second region.

In accordance with another aspect of the present invention, there is provided a process for fabricating a semiconductor integrated circuit device comprising the steps of preparing a semiconductor substrate of one conductivity type, forming a first isolating region in a portion of the semiconductor substrate for separating a first region from a second region, introducing a dopant impurity into the second region for forming a well contact region of the one conductivity type, completing a circuit component on the first region and connecting the well contact region to a conductive wiring line to be connected to a constant voltage source.

BRIEF DESCRIPTION OF THE DRAWINGS

The features and advantages of the semiconductor device and the process will be more clearly understood from the following description taken in conjunction with the accompanying drawings in which.

DESCRIPTION OF THE PREFERRED EMBODIMENTS

First Embodiment

Figure 6:
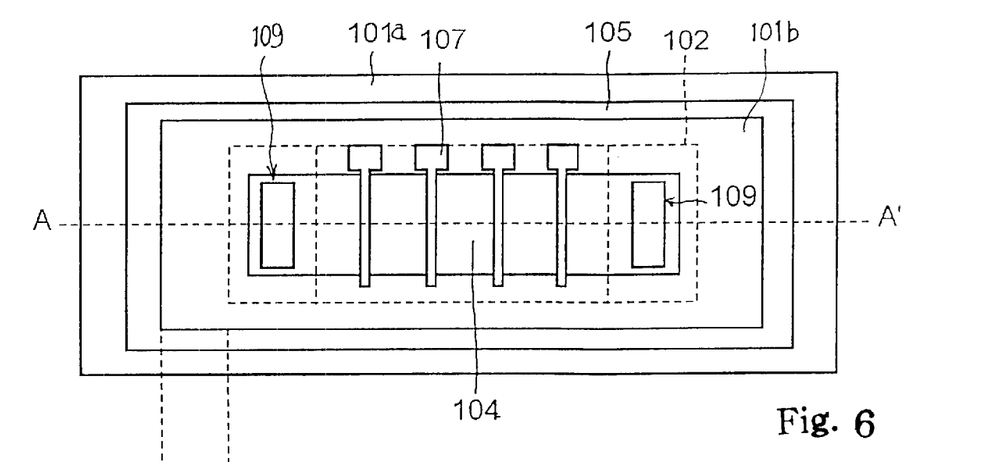
FIG. 6 is a plane view showing the layout of a composite MIS field effect transistor incorporated in a semiconductor integrated circuit device according to the present invention.
Figure 7:
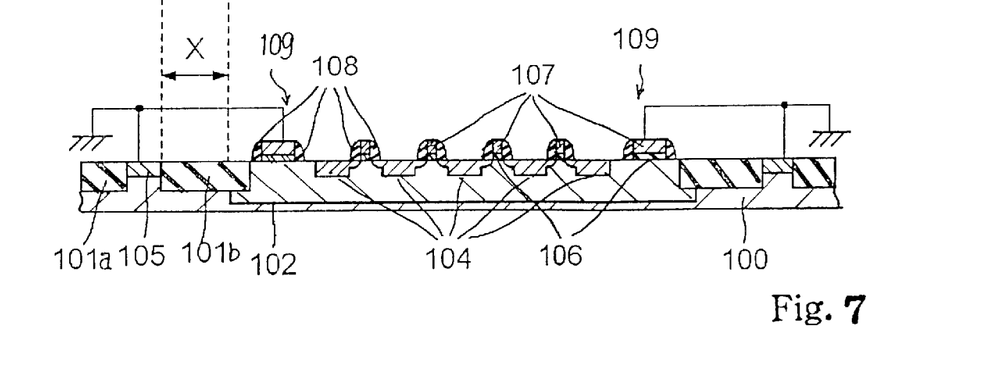
FIG. 7 is a cross sectional view taken along line A–A' of FIG. 6 and showing the structure of the semiconductor integrated circuit device.

FIGS. 6 and 7 illustrate a semiconductor integrated circuit device embodying the present invention. The semiconductor integrated circuit device comprises a p-type silicon substrate 100, and a p-type well 102 is formed in a surface portion of the p-type silicon substrate 100. A heavily-doped p-type well contact region 105 is further formed in the p-type silicon substrate 100, and is outside of the p-type well 102. An outer shallow trench isolating region 101a is formed around the heavily-doped p-type well contact region 105, and an inner shallow trench isolating region 101b is formed along the boundary between the p-type well 102 and the heavily-doped p-type well contact region 105. Thus, the heavily-doped p-type well contact region 105 is located outside of the p-type well 102, and the inner shallow trench isolating region 101b spaces the heavily-doped p-type well contact region 105 from the p-type well 102 by distance X.

The semiconductor integrated circuit device according to the present invention further comprises heavily-doped n-type source/drain regions 104, gate insulating layers 106 and gate electrodes 107. The heavily-doped n-type source/drain regions 104 are formed in the p-type well 102 at intervals, and channels are to be formed in the surface portions between the heavily-doped n-type source/drain regions 104. The surface portions are covered with the gate insulating layers 106, respectively, and the gate electrodes 107 are respectively patterned on the gate insulating layers 106. Side wall spacers 108 are formed on the side surfaces of the gate electrodes 107, and the heavily-doped n-type source/drain regions 104 have the lightly-doped drain structure. The heavily-doped n-type source/drain regions 104, the gate insulating layers 106, the gate electrodes 107 and the side wall spacers 108 as a whole constitute MIS (Metal-Insulator-Semiconductor) field effect transistors.

MIS capacitors 109 are further formed on both sides of the MIS field effect transistors. Dielectric layers 106 are formed on surface portions of the p-type well 102, and capacitor electrodes 107 are patterned on the dielectric layers 106. Side wall spacers 108 are also formed on both sides of each capacitor electrode 107. The surface portion, the dielectric layer 106, the electrode 107 and the side wall spacers 108 as a whole constitute each of the MIS capacitors 109.

The MIS transistors are equivalent to each of the field effect transistors FET1/FET2, and is hereinbelow referred to as "composite MIS field effect transistor".

The heavily-doped p-type well contact region 105 is connected to a ground line, and the electrodes 107 of the MIS capacitors 109 are connected to the heavily-doped p-type well contact region 105.

The semiconductor integrated circuit device is fabricated through a process described hereinbelow. FIGS. 8 to 19 show resultant semiconductor structures at steps in the process. Although FIGS. 8, 10, 12, 14, 16 and 18 are plan views, inter-layered insulating layers are deleted therefrom for clearly showing the layouts at those steps. The process starts with preparation of the p-type silicon substrate 100. A silicon oxide layer (not shown) is grown to 50–150 nanometers thick, and a silicon nitride layer 110 is deposited to 150–300 nanometers thick on the silicon oxide layer. The silicon oxide layer serves as a pad oxide layer. The silicon nitride layer 110 is etched by using a hot phosphoric acid. The hot phosphoric acid has small selectively between the silicon nitride and the silicon. If the silicon nitride layer 110 is directly grown on the p-type silicon substrate 100. The hot phosphoric acid is liable to damage the p-type silicon substrate 100. However, the hot phosphoric acid has large selectivity between the silicon nitride and the silicon oxide. The silicon oxide layer (not shown) prevents the p-type silicon substrate 100 from the hot phosphoric acid as well as the phosphorous. Thus, the silicon oxide layer serves as a pad layer.

Subsequently, photo-resist solution is spread over the entire surface of the silicon nitride layer 110, and is baked so as to form a photo-resist layer. A pattern image for the shallow trench isolating regions 101a/101b is transferred from a photo-mask (not shown) to the photo-resist layer, and the latent image is produced in the photo-resist layer. The latent image is developed, and the photo-resist layer is patterned into a photo-resist etching mask (not shown). Thus, the photo-resist etching mask is patterned on the silicon nitride layer 110 by using the photo-lithographic techniques.

Using the photo-resist etching mask, the silicon nitride layer 110 is selectively removed by using a dry etching technique. The photo-resist etching mask is stripped off.

Figure 8:
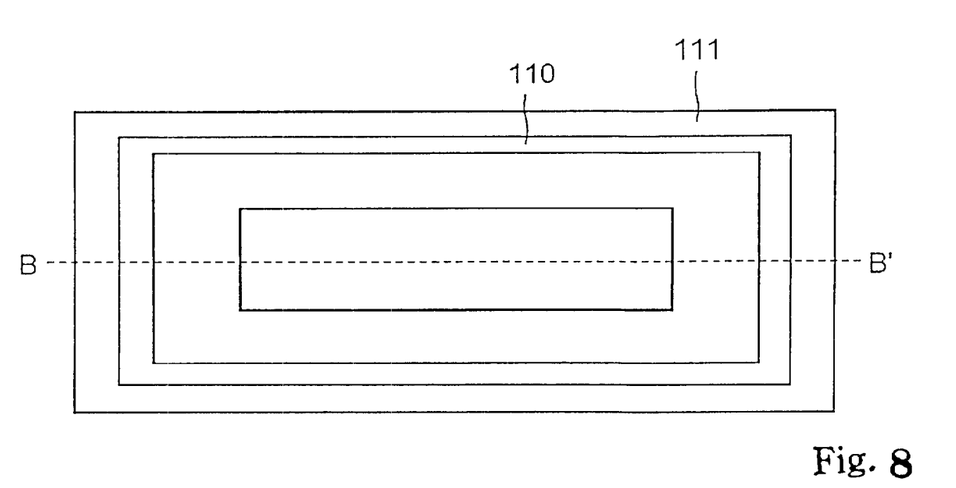
FIG. 8 is a plane view showing the layout of grooves formed in a resultant semiconductor structure in a certain step of a process for fabricating the semiconductor integrated circuit device.
Figure 9:
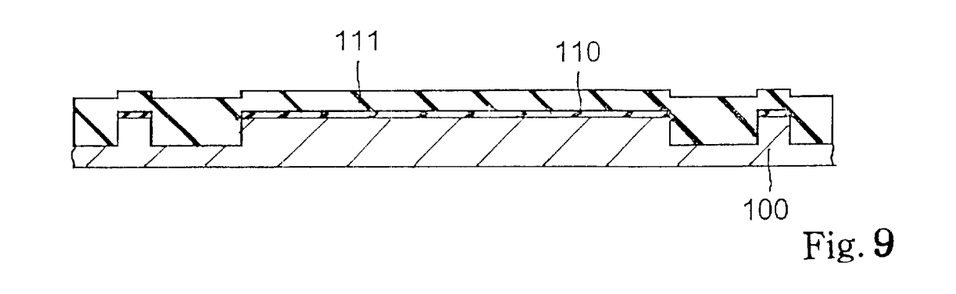
FIG. 9 is a cross sectional view taken along line B–B' of FIG. 8 and showing the resultant semiconductor structure.

Using the patterned silicon nitride layer 110, the p-type silicon substrate 100 is selectively etched, and grooves are formed in the p-type silicon substrate 100. The grooves are 300–500 nanometers deep. The photo-resist etching mask may be stripped off after the etching. The p-type silicon substrate 100 is placed in oxidizing atmosphere, and silicon oxide is grown to 10–30 nanometers thick in the grooves. Subsequently, silicon oxide is deposited over the entire surface, and the silicon oxide layer 111 is grown to 500–700 nanometers thick as shown in FIGS. 8 and 9.

Figure 10:
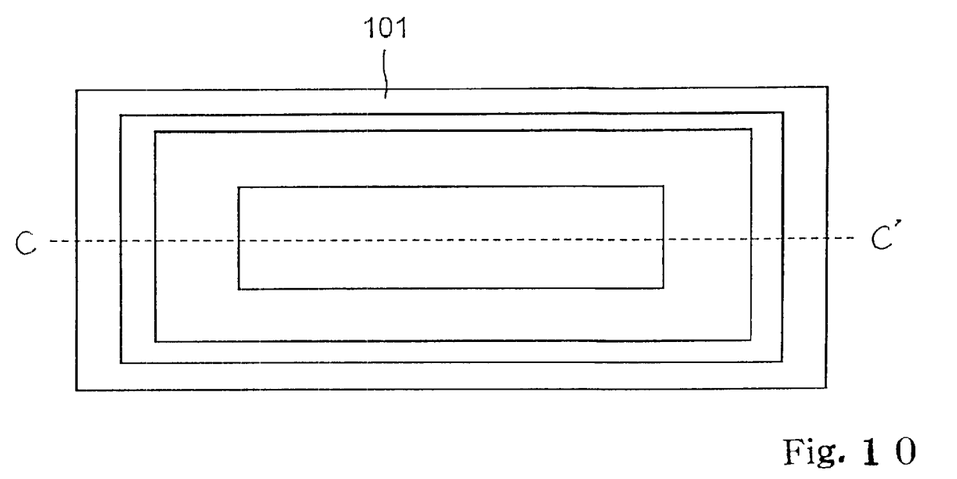
FIG. 10 is a plane view showing the layout of shallow trench isolating regions formed in a resultant semiconductor structure in another step of a process for fabricating the semiconductor integrated circuit device.
Figure 11:
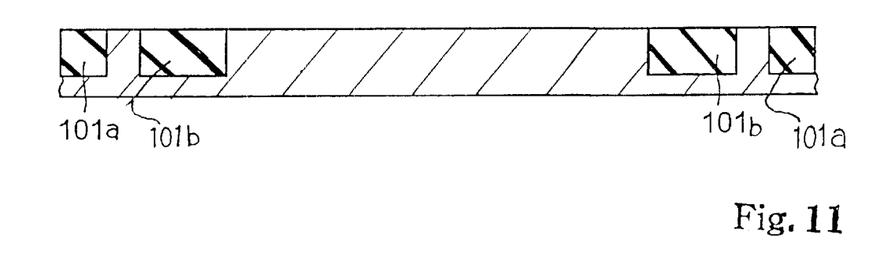
FIG. 11 is a cross sectional view taken along line C–C' of FIG. 10 and showing the resultant semiconductor structure.

The silicon oxide layer 111 and the silicon nitride layer 110 are removed by using a chemical mechanical polishing. The silicon oxide is left in the grooves, and forms the outer shallow trench isolating region 101a and the inner shallow trench isolating region 101b as shown in FIGS. 10 and 11. The upper surfaces of the shallow trench isolating regions 101a/101b are substantially coplanar with the exposed surface of the p-type silicon substrate 100.

Subsequently, a protective oxide layer (not shown) is grown on the exposed surface of the p-type silicon substrate 100, and a photo-resist ion-implantation mask (not shown) is patterned on the protective oxide layer by using the photo-lithographic techniques. The photo-resist ion-implantation mask has an opening over the area assigned to the p-type well 102. Boron is ion implanted into the p-type silicon substrate 100, and forms the p-type well 102. In order to make the impurity profile of the p-type well 102 retrograde, the acceleration energy is adjusted to 100–400 KeV, and the ion-implantation is repeated several times. The photo-resist ion-implantation mask is stripped off.

Another photo-resist ion implantation mask (not shown) is patterned on the protective oxide layer by using the photo-lithographic techniques, and boron is ion implanted into the regions assigned to the channels at 50 KeV or less so as to regulate the threshold of the MIS field effect transistors to a predetermined value. If the MIS field effect transistors are p-channel type, phosphorous is ion implanted for the channel doping. The photo-resist ion implantation mask is stripped off, and the protective oxide layer is etched away.

Subsequently, silicon oxide is grown to 2–5 nanometers thick, and forms the gate insulating layers 106 and the dielectric layers 106. Polysilicon is deposited over the entire surface, and forms a polysilicon layer. A photo-resist etching mask (not shown) is patterned on the polysilicon layer by using the photo-lithographic techniques. The polysilicon layer is selectively etched away by using the photo-resist etching mask, and the gate electrodes 107 and the capacitor electrodes 107 are left on the gate insulating layers 106 and the dielectric layers 106, respectively. The photo-resist etching mask is stripped off.

Subsequently, n-type dopant impurity is ion implanted into the p-type well 102 so as to form lightly-doped n-type impurity regions. Silicon oxide or silicon nitride is deposited over the entire surface, and the gate electrodes 107 and the capacitor electrodes 107 are covered with the insulating layer. The insulating layer is etched without any photo-resist etching mask until the gate electrodes 107 and the capacitor electrodes 107 are exposed. Then, the side wall spacers 108 are formed on the side surfaces of the gate electrodes 107 and the side surfaces of the capacitor electrodes 107. N-type dopant impurity is ion implanted into the p-type well 102, and forms heavily-doped n-type impurity regions. The heavily-doped n-type impurity regions are partially overlapped with the lightly-doped n-type impurity regions, and form the LDD source/drain regions 104. The n-type dopant impurity may be arsenic. If the MIS field effect transistors are of the p-channel type, boron or boron difluoride $BF_2$ may be ion implanted.

The MIS field effect transistors are used for the high-frequency switching circuit. In order to reduce the parasitic capacitance coupled to the drain, an even number of gate electrodes 107 are prepared for the composite MIS field effect transistor, and the outermost n-type impurity regions 104 serve as a source of the composite MIS field effect transistor.

Figure 12:
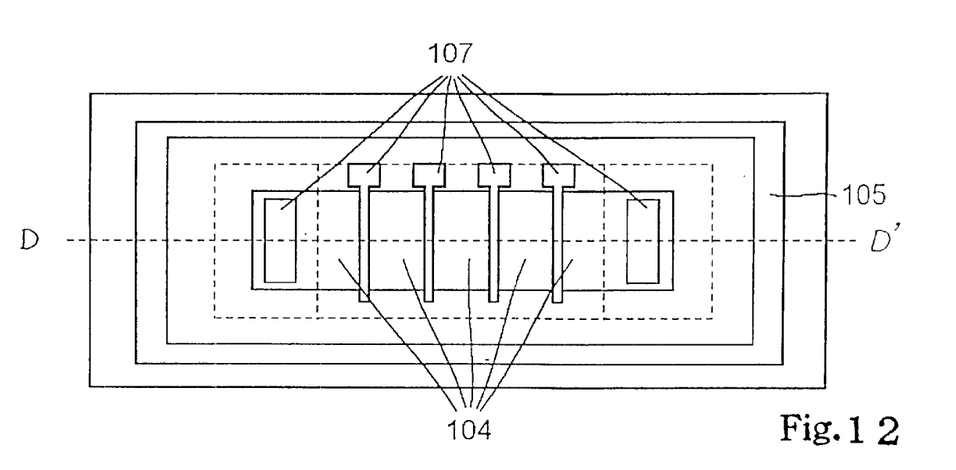
FIG. 12 is a plane view showing the layout of electrodes and impurity regions formed in a resultant semiconductor structure in yet another step of a process for fabricating the semiconductor integrated circuit device.
Figure 13:
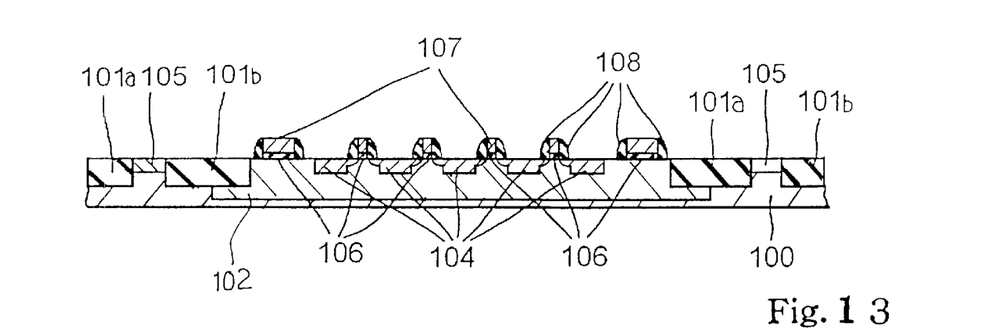
FIG. 13 is a cross sectional view taken along line D–D' of FIG. 12 and showing the resultant semiconductor structure.

Subsequently, a photo-resist ion implantation mask (not shown) is formed on the resultant semiconductor structure, and has an opening over the area assigned to the heavily-doped p-type well contact region 105. P-type dopant impurity is ion implanted into the p-type silicon substrate 100, and forms the heavily-doped p-type well contact region 105. The resultant semiconductor structure is shown in FIGS. 12 and 13.

The resultant semiconductor structure is annealed at 1000–1100 degrees in centigrade for 10–30 seconds by using a lamp annealing technique, and the n-type dopant impurity and the p-type dopant impurity are activated in the n-type source/drain regions 104 and the heavily-doped p-type well contact region 105.

Figure 14:
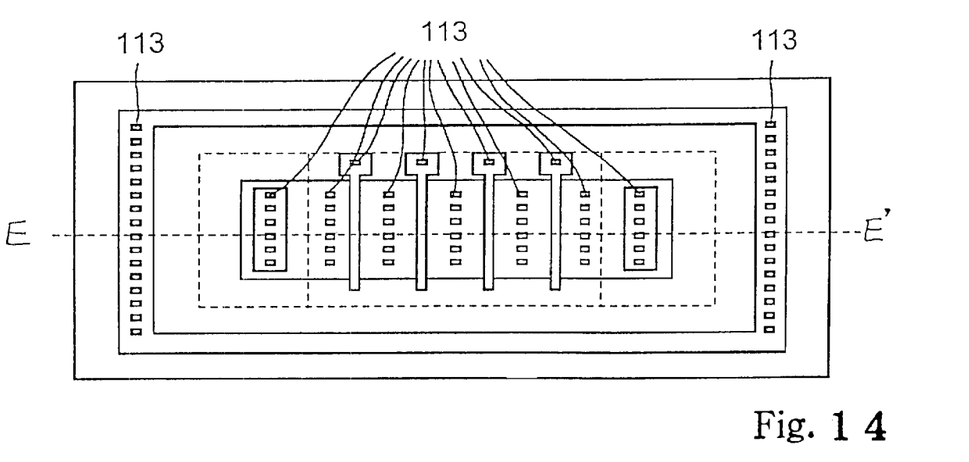
FIG. 14 is a plane view showing the layout of contact holes formed in a resultant semiconductor structure in still another step of a process for fabricating the semiconductor integrated circuit device.
Figure 15:
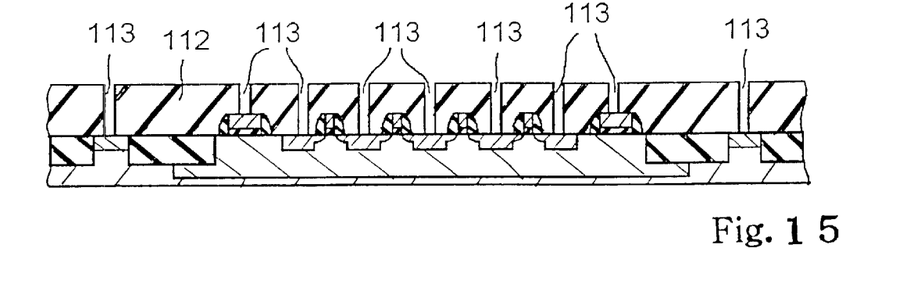
FIG. 15 is a cross sectional view taken along line E–E' of FIG. 14 and showing the resultant semiconductor structure.

Cobalt is deposited over the entire surface of the resultant semiconductor structure. The cobalt reacts with the silicon. As a result, cobalt silicide layers are laminated on the n-type source/drain regions 104 and the gate electrodes 107. Insulating material is deposited over the entire surface of the resultant semiconductor structure, and forms a first inter-layered insulating layer 112. A photo-resist etching mask (not shown) is patterned on the first inter-layered insulating layer 112 by using the photo-lithographic techniques, and the first inter-layered insulating layer 112 is selectively etched. Contact holes 113 are formed in the first inter-layered insulating layer 112, and the n-type source/drain regions 104, the gate electrodes 117, the capacitor electrodes 117 and the heavily-doped p-type well contact region 105 are exposed to the contact holes 113, respectively, as shown in FIGS. 14 and 15.

Figure 16:
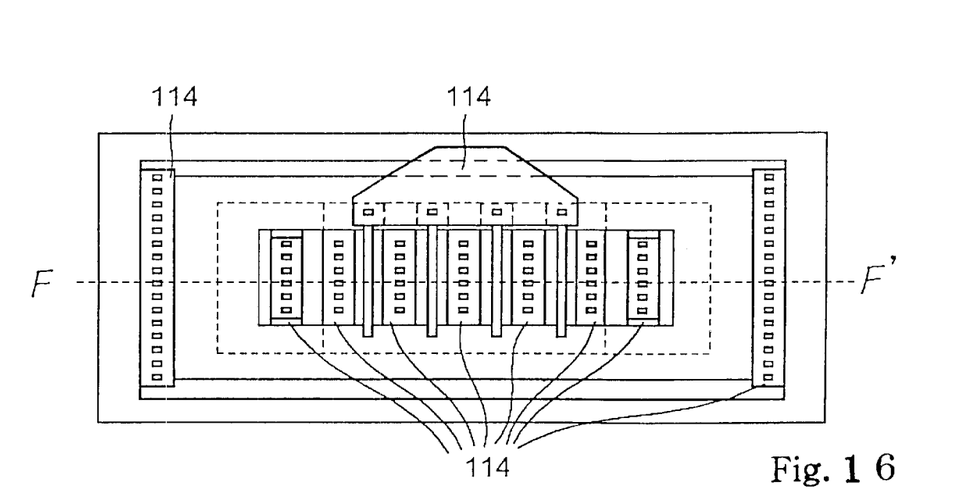
FIG. 16 is a plane view showing the layout of first-level conductive wiring layers formed in a resultant semiconductor structure in yet another step of a process for fabricating the semiconductor integrated circuit device.
Figure 17:
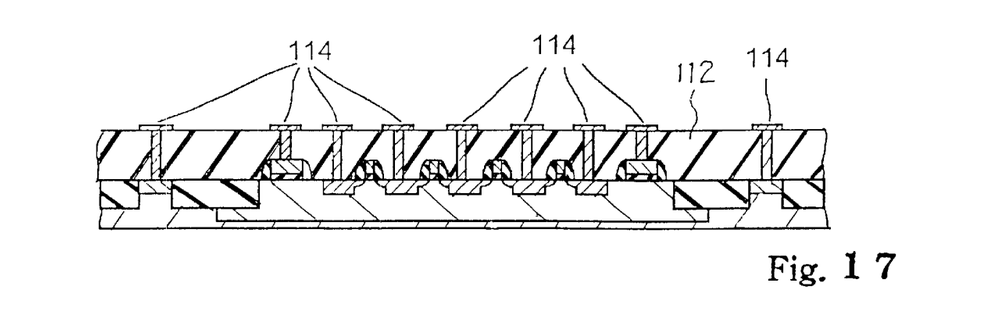
FIG. 17 is a cross sectional view taken along line F–F' of FIG. 16 and showing the resultant semiconductor structure.

Subsequently, conductive material such as, for example, aluminum or aluminum alloy is deposited over the entire surface of the resultant semiconductor structure. The conductive material fills the contact holes 113, and forms a conductive layer on the upper surface of the first inter-layered insulating layer 112. The conductive layer is subjected to the chemical mechanical polishing, and a flat surface is created. A photo-resist etching mask (not shown) is patterned on the conductive layer by using the photo-lithographic techniques, and the conductive layer is selectively etched for forming first-level conductive wiring layers 114 as shown in FIGS. 16 and 17. Although the contact holes 113 are covered with the first-level conductive wiring layers 114, the positions of the contact holes 113 are indicated by small boxes in FIG. 16. All the gate electrodes 107 are connected through the contact holes 113 to one of the first-level conductive wiring layers 114.

Subsequently, insulating material is deposited over the entire surface of the resultant semiconductor structure, and forms a second inter-layered insulating layer 115. A photo-resist etching mask (not shown) is patterned on the second inter-layered insulating layer 115, and the second inter-layered insulating layer 115 is selectively etched for forming through-holes 116.

Figure 18:
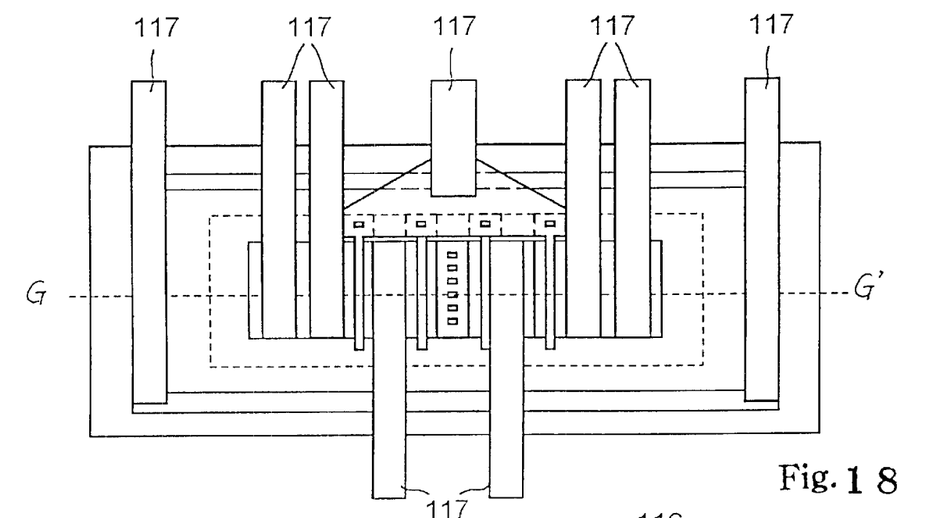
FIG. 18 is a plane view showing the layout of second-level conductive wiring layers formed in a resultant semiconductor structure in still another step of a process for fabricating the semiconductor integrated circuit device.
Figure 19:
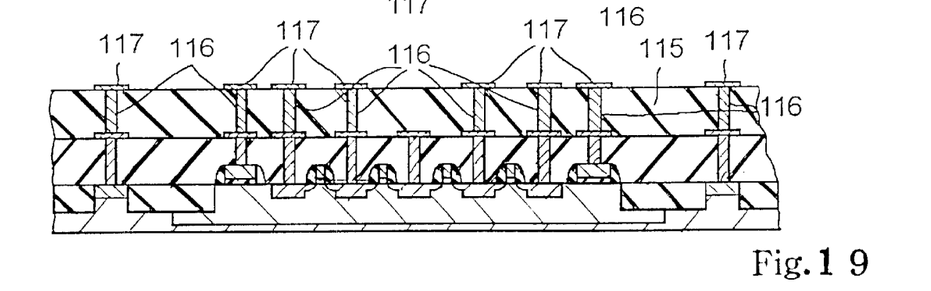
FIG. 19 is a cross sectional view taken along line G–G' of FIG. 17 and showing the resultant semiconductor structure.

Conductive material such as, for example, aluminum or aluminum alloy is deposited over the entire surface. The conductive material fills the through-holes 116, and forms a conductive layer. The conductive layer is planarized through the chemical mechanical polishing. A photo-resist etching mask (not shown) is patterned on the conductive layer, and the conductive layer is selectively etched. The conductive layer is patterned into second-level conductive wiring layers 117 as shown in FIGS. 18 and 19. The heavily-doped p-type well contact region 115 is biased through the outermost conductive wiring layers 114/117, and the capacitor electrodes 107 are connected to the conductive wiring layers 114/117 next to the outermost conductive wiring layers 114/117. The n-type source/drain regions 104 are connected to the conductive wiring layers 114/117 inside thereof.

Although the composite MIS field effect transistor has the comb-like gate electrode 107/114, the first-level conductive wiring layer 114 is formed on the first inter-level insulating layer 112, and the comb-like gate electrode 107/114 never interferes with the second-level conductive wiring layers 117 connected to the n-type source/drain regions 104. Moreover, the comb-like gate electrode 107/114 is separated from the second-level conductive wiring layers 117 connected to the n-type source/drain regions 104 by means of the second inter-layered insulating layer 115. For this reason, a parasitic capacitor coupled therebetween is relatively small.

As will be understood from the foregoing description, the heavily-doped p-type well contact region 105 is formed outside of the p-type well 102, and the p-type well 102 is biased through the heavily-doped p-type well contact region 105. This results in that a large substrate resistance is created between the p-type well 102 and the heavily-doped p-type well contact region 105. Moreover, the capacitors 109 are coupled to the p-type well 102, and the heavily-doped p-type well 102 and the capacitors 109 are biased with the constant voltage source. The capacitance of the capacitor 109 is dependent on the dimensions thereof, and the manufacturer can appropriately design the capacitance of the capacitors 109. Thus, the manufacturer can design the substrate impedance in order to restrict the leakage current at a high-frequency.

Second Embodiment

Figure 20:
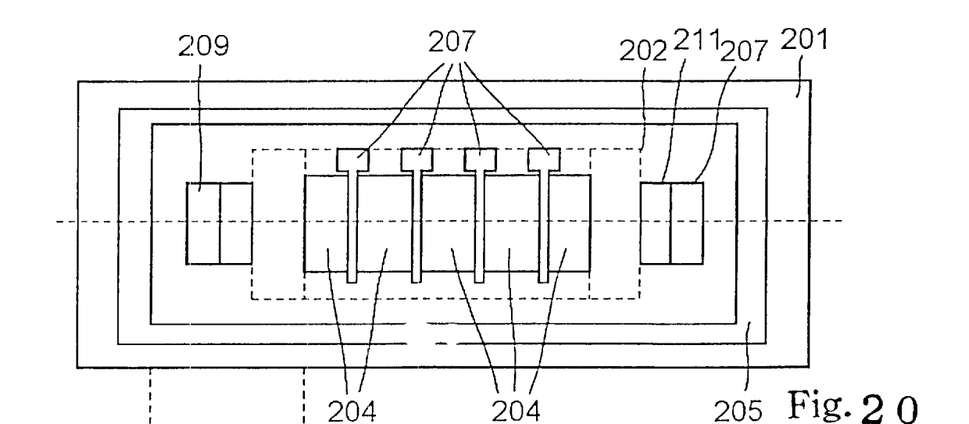
FIG. 20 is a plane view showing the layout of a composite MIS field effect transistor incorporated in another semiconductor integrated circuit device according to the present invention.
Figure 21:
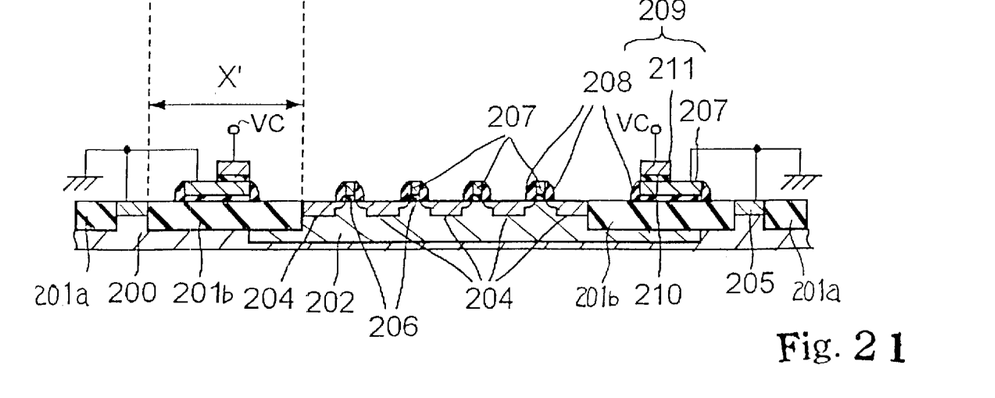
FIG. 21 is a cross sectional view taken along line H–H' of FIG. 20 and showing the structure of the semiconductor integrated circuit device.

FIGS. 20 and 21 illustrate a composite MIS field effect transistor incorporated in another semiconductor integrated circuit device embodying the present invention. The semiconductor integrated circuit device comprises a p-type silicon substrate 200, and a p-type well 202 is formed in a surface portion of the p-type silicon substrate 200. A heavily-doped p-type well contact region 205 is further formed in the p-type silicon substrate 200, and is located outside of the p-type well 202. An outer shallow trench isolating region 201a is formed around the heavily-doped p-type well contact region 205, and an inner shallow trench isolating region 201b is formed along the boundary between the p-type well 202 and the heavily-doped p-type well contact region 205. Thus, the heavily-doped p-type well contact region 205 is located outside of the p-type well 202, and the inner shallow trench isolating region 201b spaces the heavily-doped p-type well contact region 205 from the p-type well 202 by distance X'. In order to increase the substrate resistance, the distance X' may be greater than the distance X.

The semiconductor integrated circuit device according to the present invention further comprises heavily-doped n-type source/drain regions 204, gate insulating layers 206 and gate electrodes 207. The heavily-doped n-type source/drain regions 204 are formed in the p-type well 202 at intervals, and channels are to be formed in the surface portions between the heavily-doped n-type source/drain regions 204. The surface portions are covered with the gate insulating layers 206, respectively, and the gate electrodes 207 are respectively patterned on the gate insulating layers 206. Side wall spacers 208 are formed on the side surfaces of the gate electrodes 207, and the heavily-doped n-type source/drain regions 204 have the lightly-doped drain structure. The heavily-doped n-type source/drain regions 204, the gate insulating layers 206, the gate electrodes 207 and the side wall spacers 208 as a whole constitute MIS field effect transistors. The MIS field effect transistors are equivalent to the composite MIS field effect transistor.

Capacitors 209 are further formed on the inner shallow trench isolating region 201b, and each capacitor 209 comprises a lower capacitor electrode 207, a dielectric layer 210 and an upper capacitor electrode 211. The lower capacitor electrodes 207 are formed of polysilicon, and are patterned concurrently with the gate electrodes 207. The dielectric layers 210 are formed on the lower capacitor electrodes 207, respectively, and the upper capacitor electrodes 211 are patterned on the dielectric layers 210. The upper capacitor electrodes 211 are formed of polysilicon. Side wall spacers 208 are also formed on both sides of each lower capacitor electrode 207. The lower capacitor electrodes 207 are connected to the heavily-doped p-type well contact region 205 and the ground. On the other hand, a control voltage VC is applied to the upper capacitor electrodes 211. The control voltage VC is variable. For this reason, the capacitance of each capacitor 209 is adjustable to appropriate value by using the control voltage VC.

The p-type well 202, the heavily-doped well contact region 205 and the MIS field effect transistors 204/206/207/208 are fabricated on the p-type silicon substrate 200 through the process described in conjunction with the first embodiment. Precisely designed resistors and capacitors are usually required for a high-frequency circuit or an analog circuit, and are integrated on the p-type silicon substrate 200 together with the composite MIS field effect transistor. The capacitors 209 are fabricated concurrently with the capacitors of the high-frequency/analog circuit. For this reason, the fabrication process for the second embodiment is not complicated.

FIGS. 22 to 25 illustrate essential steps for fabricating the semiconductor integrated circuit device. The steps for the first embodiment are traced until the channel doping, and description is omitted for the sake of simplicity.

Subsequently, silicon oxide is grown to 2–5 nanometers thick, and forms the gate insulating layers 206 and the insulating layers 206 on the p-type well 202 and the inner shallow trench isolating region 201b. Polysilicon is deposited over the entire surface, and forms a polysilicon layer. A photo-resist etching mask (not shown) is patterned on the polysilicon layer by using the photo-lithographic techniques. The polysilicon layer is selectively etched away, and the gate electrodes 207 and the lower capacitor electrodes 207 are left on the gate insulating layers 206 and the insulating layers 206, respectively. The photo-resist etching mask is stripped off.

Subsequently, n-type dopant impurity is ion implanted into the p-type well 202 so as to form lightly-doped n-type impurity regions. Silicon oxide or silicon nitride is deposited over the entire surface, and the gate electrodes 207 and the lower capacitor electrodes 207 are covered with the insulating layer. The insulating layer is etched without any photo-resist etching mask until the gate electrodes 207 and the lower capacitor electrodes 207 are exposed. Then, the side wall spacers 208 are formed on the side surfaces of the gate electrodes 207 and the side surfaces of the lower capacitor electrodes 207. N-type dopant impurity is ion implanted into the p-type well 202, and forms heavily-doped n-type impurity regions. The heavily-doped n-type impurity regions are partially overlapped with the lightly-doped n-type impurity regions, and form the LDD source/drain regions 204.

Figure 22:
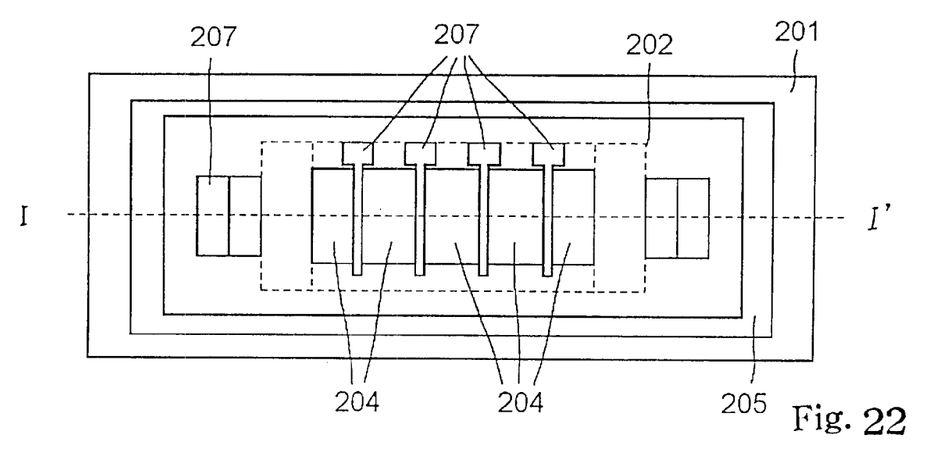
FIG. 22 is a plane view showing the layout of MIS field effect transistors formed in a resultant semiconductor structure in a step in a process for fabricating the semiconductor integrated circuit device.
Figure 23:
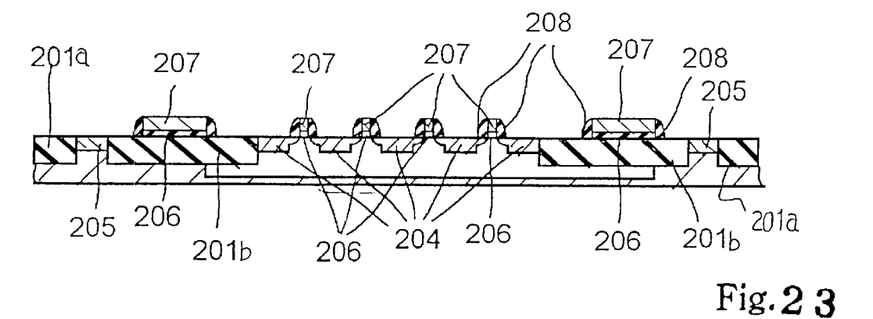
FIG. 23 is a cross sectional view taken along line I–I' of FIG. 22 and showing the resultant semiconductor structure.

Subsequently, a photo-resist ion implantation mask (not shown) is formed on the resultant semiconductor structure, and has an opening over the area assigned to the heavily-doped p-type well contact region 205. P-type dopant impurity is ion implanted into the p-type silicon substrate 200, and forms the heavily-doped p-type well contact region 205. The resultant semiconductor structure is shown in FIGS. 22 and 23.

The resultant semiconductor structure is annealed at 1000–1100 degrees in centigrade for 10–30 seconds by using a lamp annealing technique, and the n-type dopant impurity and the p-type dopant impurity are activated in the n-type source/drain regions 204 and the heavily-doped p-type well contact region 205.

Figure 24:
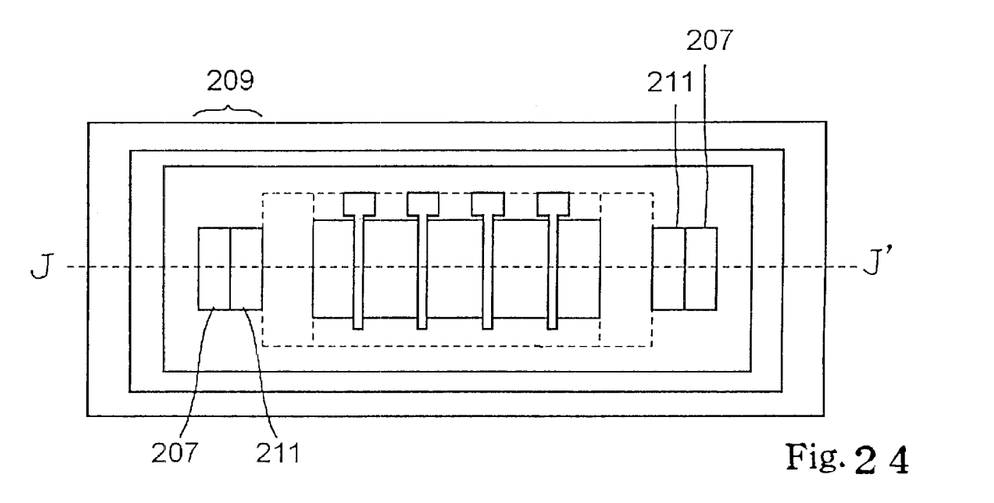
FIG. 24 is a plane view showing the layout of the MIS field effect transistors and capacitors formed in another resultant semiconductor structure in another step in the process.
Figure 25:
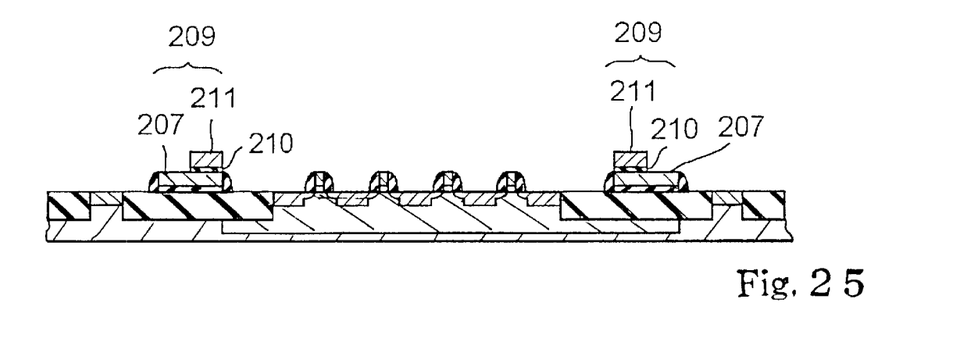
FIG. 25 is a cross sectional view taken along line J–J' of FIG. 24 and showing the resultant semiconductor structure.

Subsequently, insulating material is deposited over the entire surface of the resultant semiconductor structure, and a deposition of conductive material such as, for example, polysilicon follows. A photo-resist etching mask (not shown) is patterned on the conductive material layer, and the insulating material layer and the conductive material layer are patterned into the dielectric layers 210 and the upper capacitor electrodes 211 as shown in FIGS. 24 and 25. After the completion of the capacitors 209, the process sequence returns to those of the first embodiment.

The heavily-doped p-type well contact region 205 is spaced from the p-type well 202, and a source of bias voltage is connected to the heavily-doped p-type well contact region 205. This results in a large substrate resistance. The capacitors 209 are coupled to the heavily-doped p-type well contact region 205, and increases the impedance of the p-type silicon substrate 200. The insertion loss is improved by virtue of the heavily-doped p-type well contact region 205 and the capacitors 209.

In the embodiments described hereinbefore, the gate electrodes 107/207 of the MIS field effect transistors are 200 microns wide, and capacitance of 60 to 80 fF is coupled to the p-n junction of the source/drain regions. The capacitance coupled in parallel to the substrate resistance is at least ten times more than the capacitance coupled to the p-n junction.

Figure 26:
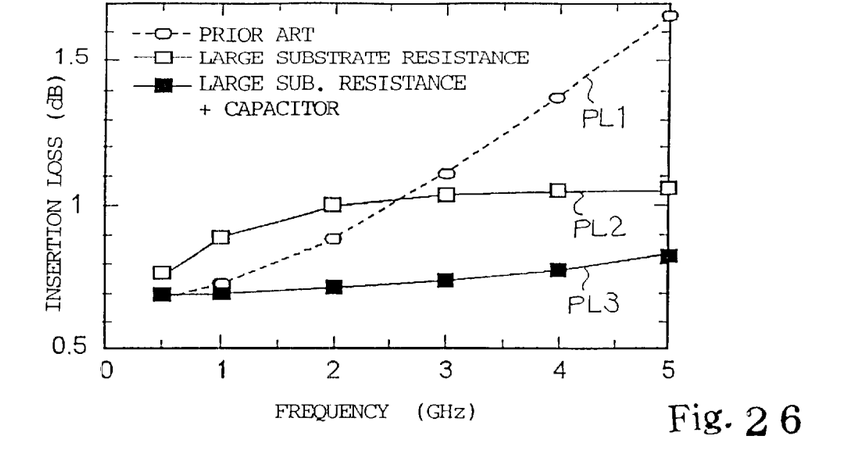
FIG. 26 is a graph showing a relation between a frequency and an insertion loss.

The present inventor evaluated the semiconductor integrated circuit devices described hereinbefore. The insertion loss was determined in terms of the frequency applied to the gate electrodes. The prior art semiconductor integrated circuit device did not have any capacitor coupled in parallel to the substrate resistance, and the heavily-doped p-type well contact region was formed in the p-type well. The substrate resistance was 60 ohms, and the insertion loss was increased together with the frequency as indicated by plots PL1 (see FIG. 26). A semiconductor integrated circuit device had the heavily-doped p-type well contact region spaced from the p-type well by the inner shallow trench isolating region, but any capacitor was not coupled to the substrate resistance. The substrate resistance was increased to 600 ohms by virtue of the heavily-doped p-type well contact region spaced from the p-type well, and the insertion loss was improved from 2.5 GHz as indicated by plots PL2. Another semiconductor integrated circuit device had both of the capacitor and the heavily-doped p-type well contact region spaced from the p-type well. The capacitor was coupled in parallel to the substrate resistance, and had the capacitance of 1 pF. The insertion loss was improved over the band as indicated by plots PL3.

When the substrate resistance was increased, the direct current raised the potential of the silicon substrate. However, the capacitor restricted the potential of the silicon substrate. For this reason, the insertion loss was drastically improved.

As will be understood from the foregoing description, the heavily-doped well contact region spaced from the well is effective against the insertion loss in relatively high-frequency band, and the heavily-doped well contact region spaced from the well and the capacitor coupled in parallel to the substrate resistance are effective against the insertion loss in both of the high-frequency band and the low-frequency band.

Although particular embodiments of the present invention have been shown and described, it will be apparent to those skilled in the art that various changes and modifications may be made without departing from the spirit and scope of the present invention.

What is claimed is:

1. A semiconductor integrated circuit device comprising:

a semiconductor substrate of a first conductivity type;

a well of said first conductivity type formed in a first region of said semiconductor substrate;

a circuit component fabricated on said well;

a well contact region of said first conductivity type formed in a second region of said semiconductor substrate, said second region spaced from said first region, said well contact region connected to a constant voltage source for supplying a bias voltage through said semiconductor substrate to said well; and a first isolating region formed in a portion of said semiconductor substrate located between said first region and said second region, wherein said first isolating region comprises a dielectric material.

2. The semiconductor integrated circuit device as set forth in claim 1, in which said second region encircles said first region.

3. The semiconductor integrated circuit device as set forth in claim 1, in which said circuit component comprises a field effect transistor having impurity regions having a second conductivity type opposite to said first conductivity type and formed in said well, a gate insulating layer formed on an area of said well between said impurity regions, and a gate electrode formed on said gate insulating layer.

4. The semiconductor integrated circuit device as set forth in claim 1, further comprising:

a capacitor coupled to said well contact region.

5. The semiconductor integrated circuit device as set forth in claim 4, in which said capacitor comprises:

a surface portion of said well;

a dielectric layer formed on said surface portion of said well; and a conductive layer formed on said dielectric layer.

6. The semiconductor integrated circuit device as set forth in claim 4, wherein said capacitor comprises:

a surface portion of said well;

a dielectric layer formed on said surface portion of said well; and a conductive layer formed on said dielectric layer, and wherein said circuit component comprises a field effect transistor comprising:

at least two impurity regions having a second conductivity type opposite to said first conductivity type, said impurity regions formed in said well;

a gate insulating layer formed on an area of said well between said impurity regions; and a gate electrode formed on said gate insulating layer.

7. The semiconductor integrated circuit device as set forth in claim 4, in which said capacitor comprises:

a lower electrode formed on said first isolating region;

a dielectric layer formed on said lower electrode; and an upper electrode formed on said dielectric layer.

8. A semiconductor integrated circuit device as set forth in claim 4, in which said capacitor comprises a component biased with a variable voltage.

9. The semiconductor integrated circuit device as set forth in claim 1, further comprising:

a second isolating region formed in a fourth region of said semiconductor substrate around said second region.

10. A semiconductor integrated circuit device comprising a substrate of a first conductivity type having a first level of impurity doping;

a first well of said first conductivity type located on a top surface of said substrate in a first region of said substrate, said first well having a second level of impurity doping higher than said first level;

at least one circuit component fabricated on top of or embedded in said first well; and a second well formed outside said first region, said second well being out of contact with said first well, said second well having an impurity doping level higher than said first level of impurity doping, said second well providing a contact region for a bias voltage to permit an indirect bias to said first well via said substrate.

11. The semiconductor device of claim 10, further comprising an isolator formed adjacent said first region to isolate said first region and said second region, said isolator embedded in said top surface.

12. The semiconductor device of claim 11, wherein said isolator comprises a region of dielectric material.

13. The semiconductor device of claim 11, further comprising a capacitor interconnecting said well and said well contact, said capacitor fabricated on said top surface of one of said second region and said isolator.

14. The semiconductor device of claim 12, wherein said dielectric material is formed in a shallow trench on said top surface of said substrate.

* * * * *